(12) United States Patent
Yokoyama et al.

(10) Patent No.: US 6,818,974 B2
(45) Date of Patent: Nov. 16, 2004

(54) SEMICONDUCTOR DEVICE (75) Inventors: Kazuo Yokoyama, Hiroshima (JP); Shigeki Kageyama, Tokyo (JP); Jun Otsuji, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 33 days.

(21) Appl. No.: 10/353,950

(22) Filed: Jan. 30, 2003

(65) Prior Publication Data

US 2004/0026777 A1 Feb. 12, 2004

(30) Foreign Application Priority Data

Aug. 8, 2002 (JP) ........................................ 2002-231832

(51) Int. Cl.[7] .............................................. H01L 23/48
(52) U.S. Cl. ...................... 257/676; 257/200; 257/706; 257/712; 361/399; 361/699; 361/704
(58) Field of Search ................................ 257/659, 706, 257/712, 713, 200, 676; 361/399, 699, 704

(56) References Cited

U.S. PATENT DOCUMENTS

| | | | |
|---|---|---|---|
| 5,757,031 A | | 5/1998 | Natsume |
| 5,757,081 A | | 5/1998 | Chang et al. |
| 6,207,354 B1 | * | 3/2001 | Bhatt et al. ............... 430/313 |
| 6,246,115 B1 | * | 6/2001 | Tang et al. ................. 257/706 |
| 6,472,741 B1 | * | 10/2002 | Chen et al. ................. 257/712 |

FOREIGN PATENT DOCUMENTS

| | | | | |
|---|---|---|---|---|
| JP | 7-106471 | | 4/1995 | |
| JP | 07-106471 | * | 4/1995 | ........... H01L/23/28 |

OTHER PUBLICATIONS

"Starting Delivery of GaAsFET Power Amblifier Modules of PDC", http://www.mitsubishielectric.co.jp/news/2001/0314-b.htm.

* cited by examiner

Primary Examiner—David Nelms
Assistant Examiner—Dao H. Nguyen
(74) Attorney, Agent, or Firm—Leydig, Voit & Mayer, Ltd.

(57) ABSTRACT

A semiconductor device which has a preferable construction for downsizing, in which chip part(s) and a cap are not short-circuited, is provided. The semiconductor device includes: a substrate having a first surface with a cavity and a second surface opposite to the first surface; a semiconductor chip arranged in the cavity; a chip part mounted on the second surface of the substrate; a heat sink which is mounted on the second surface of the substrate and transfers heat liberated from the chip; a cap which is fitted to the substrate, covers the second surface of the substrate, and is joined to the heat sink; and an insulator provided between the cap and the chip part. By providing the insulator, short-circuiting of the chip part and the cap is prevented. Consequently, a distance between the cap and chip part can be shortened to downsize the size of semiconductor device.

9 Claims, 9 Drawing Sheets

SEMICONDUCTOR DEVICE

BACKGROUND OF THE INVENTION

1. Field of the Invention

The present invention relates to a semiconductor device with parts mounted on a surface of a substrate and with a cap for radiating heat provided over the parts.

2. Description of the Background Art

Conventionally, semiconductor modules with parts mounted on surfaces of respective multi-layer substrates have been known. For this kind of semiconductor modules, a requirement exists that parts are mounted in an efficient mounting area. Therefore, some of semiconductor modules have cavities provided on rear surfaces of respective multi-layer substrates so that semiconductor chips can be arranged in the cavities. This kind of semiconductor module has a heat sink located on another surface of the multi-layer substrate opposite to the surface where the semiconductor chip is provided. The heat sink is joined to the cap of semiconductor module. Because the cap is formed by metal with high thermal conductivity, heat liberated from the semiconductor chip is radiated via the heat sink and the cap. According to this arrangement, the semiconductor module stably operates.

In recent years, requests for downsizing products such as cellular phones have increased, and as a result, a need to still further downsizing semiconductor modules such as power amplifier modules arises.

In the arrangement of the conventional semiconductor module, the module cannot be downsized because the size of heat sink is respectively large. The reason is that a fear of short-circuiting the cap and chip parts arises, when the heat sink and the cap are downsized to suppress size of the module.

For example, consider the case to change the heat sink from type 1608 (1.6 mm×0.8 mm) to type 1005 (1.0 mm×0.5 mm) that bulk feeders can operate. Level of the heat sink reaches the same as that of other 1005 chip parts (for example, L, C, R). Depending on tolerances of chip parts, the cap and chip parts may electrically short-circuiting. Note that the term "tolerances" means a difference in size between maximum and minimum values allowed from the viewpoint of specifications.

Although it is possible to change all the chip parts to type 0603 (0.6 mm×0.3 mm), some of the parts of type 0603 do not satisfy necessary characteristics. Thus, cost increases as a result. In addition, in the case caps are not used and heat is radiated through, for example, molds, shielding capability for preventing leakage of electric power as well as influence on peripheral parts is required for current products. To provide shielding capability, further different configuration is required, and as a result, downsizing is unable to be achieved and the cost increases.

SUMMARY OF THE INVENTION

It is an object of the present invention to provide a semiconductor device of an arrangement in which chip parts and caps are not short-circuited and at the same time which achieves downsizing.

The first semiconductor device according to the present invention includes a substrate, a semiconductor chip, at least one chip part, a heat sink, a cap and an insulator. The substrate has a first surface with a cavity and a second surface on the opposite side of the first surface. The semiconductor chip is arranged in the cavity and electrically connected to the substrate. The at least one chip part is mounted on the second surface of the substrate and electrically connected to the substrate. The heat sink is mounted on the second surface of the substrate and transfers heat liberated from the semiconductor chip. The cap is fitted to the substrate, covers the second surface of the substrate, and is joined to the heat sink. The insulator is provided between the cap and the at least one chip part.

By providing the insulator, for example, thermoplastic resin, short-circuiting of the chip part and the cap is prevented. Consequently, a distance between the cap and chip part can be shortened to downsize the size of semiconductor device. The size of the semiconductor device can be further and more effectively downsized by reducing size of the heat sink.

The second semiconductor device according to the present invention includes a substrate, a semiconductor chip, at least one chip part, a heat sink and a cap. The substrate has a first surface with a cavity and a second surface on the opposite side of the first surface. The semiconductor chip is arranged in the cavity and electrically connected to the substrate. The at least one chip part mounted on the second surface of the substrate and electrically connected to the substrate. The heat sink is mounted on the second surface of the substrate and transfers heat liberated from the semiconductor chip. The cap is fitted to the substrate, covers the second surface of the substrate, and is joined to the heat sink. Further, the cap is bent in the substrate direction at an outer edge of a region where the cap is joined to the heat sink. According to the above arrangement, short-circuiting between the cap and chip parts can be avoided without providing insulation film between the cap and chip parts.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which.

DETAILED DESCRIPTION OF THE PREFERRED EMBODIMENTS

Referring now to the attached drawings, preferred embodiments 1 through 3 of the present invention will be described as follows. In the drawings, the same reference characters are designated to elements with same or similar functions. Semiconductor modules described in the following embodiments are intended such as power amplifier modules and small-size high-frequency modules.

Embodiment 1

Figure 1:
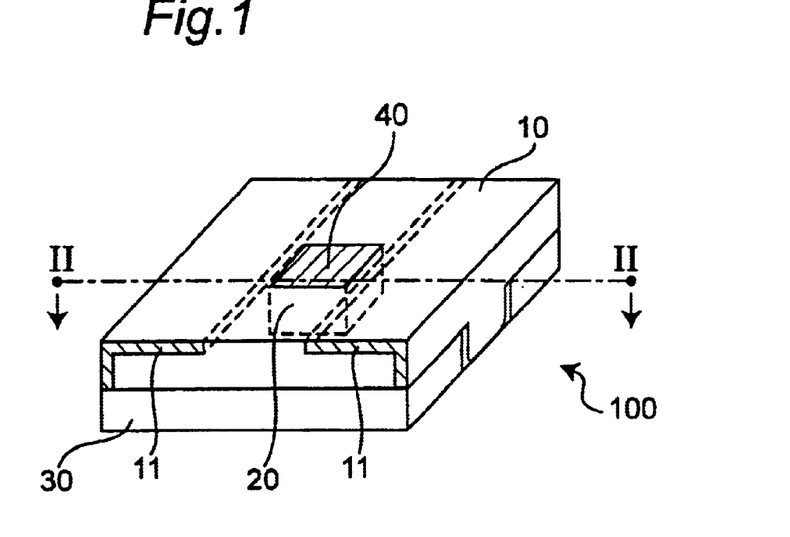
FIG. 1 is a perspective view of a semiconductor module according to embodiment 1.

FIG. 1 is a perspective view of semiconductor module 100 according to embodiment 1. Semiconductor module 100 is formed with cap 10 fitted over multi-layer substrate 30. As described later, on a rear surface of multi-layer substrate 30, a cavity, that is, a hollow section, or a recessed section from the rear surface of the substrate is provided, in which one or more semiconductor chips (not illustrated) are mounted. On the other hand, on the opposite side of multi-layer substrate 30 of the semiconductor chip, heat sink 20 is provided. Cap soldering material 40 is applied to heat sink 20, by which heat sink 20 and cap 10 are physically fixed. As a result, heat liberated from the semiconductor chip is transmitted to the surface of multi-layer substrate 30 and radiated to outside via heat sink 20, cap soldering material 40, and cap 10.

One of primary features of semiconductor module 100 is that insulation film 11 is affixed to the surface of the rear side (opposite side of outer surface) of cap 10. To explain more in detail, cap 10 is formed with metal with high thermal conductivity, such as copper, aluminum, etc., in order to function as a shield for preventing leakage of electric power and influence on peripheral parts to improve heat radiation performance. Consequently, if cap 10 is short-circuited with one or more chip parts (hereinafter referred to as "chip parts") on multi-layer substrate 30, element destruction and overheat would occur, causing danger and at the same time preventing them from exhibiting their originally intended performance.

Because of the above reason, insulation film 11 is affixed to the rear surface of cap 10 facing multi-layer substrate 30 so that short-circuiting between chip parts (not illustrated) and cap 10 is prevented. Film 11 is affixed to, for example, a strip-form section including one or more regions facing chip parts 80. Insulation film 11 may be made of publicly known materials, such as epoxy resin (for example, Obi-One Coat) as thermosetting resin, polyimide resin (for example, PIMET of Sumitomo Electric Industries), etc. However, because cap soldering material 40 on heat sink 20 must come in direct contact with cap 10, no insulation film is affixed to a strip-form region at the upper part of heat sink 20. The thickness of heat insulation film is, for example, 50–200 μm.

Figure 2:
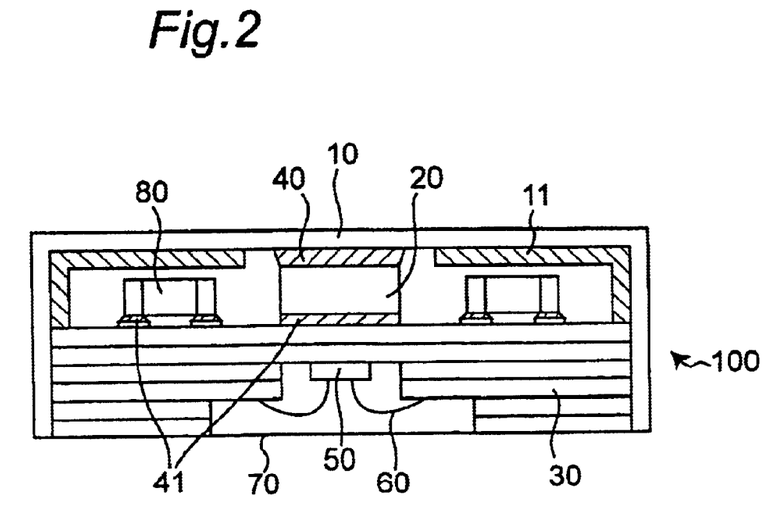
FIG. 2 is a cross-sectional view of the semiconductor module cut along line A—A' of FIG. 1.

FIG. 2 is a cross-sectional semiconductor module 100 cut along line A—A' in FIG. 1. As clear from the figure, semiconductor module 100 has parts (Surface Mounted Device; SMD) mounted on multi-layer substrate 30, and is formed by fitting cap 10 into multi-layer substrate 30 as a shield. In addition, a cavity is provided on the rear side of multi-layer substrate 30, and semiconductor chip 50 is electrically connected to multi-layer substrate 30 by bonding wire 60. When connection is secured by bonding wire 60, the cavity is filled with potting material 70 and semiconductor chip 50 is sealed.

Insulation film 11 lies between cap 10 and chip parts 80 which are mounted on multi-layer substrate 30. According to this configuration, short-circuiting can be prevented. In addition, it is understood that no insulation film 11 is affixed at the upper part of region 20 and cap soldering material 40 is fixed directly in contact with cap 10. To spaces where no insulation film 11 is affixed, chip parts 80 may be mounted if levels of chip parts 80 are lower than heat sink 20. Note that chip parts with the same levels as the heat sink 20 or with levels higher than heat sink 20 cannot be mounted on the spaces depending on parts tolerances. Further note that soldering material 41 is used to connect multi-layer substrate 30 and heat sink 20, and to connect multi-layer substrate 30 and chip parts 80 parts.

In the case that size of heat sink 20 is reduced from type 1608 (1.6 mm×0.8 mm) to type 1005 (1.0 mm×0.5 mm, height 0.5 mm±0.05 mm), inductors of type 1005 (height 0.45 mm±0.05 mm) can be used. This is because short-circuiting may not occur because of presence of insulation film 11. Accordingly, the distance between chip parts 80 and cap 10 can be reduced. At the same time, since the mounting area of heat sink 20 and its size in the height direction can be reduced, height of semiconductor module 100 in the direction vertical to multi-layer substrate 30 can also be reduced. Consequently, the whole size of semiconductor module 100 can be reduced.

Figure 3:
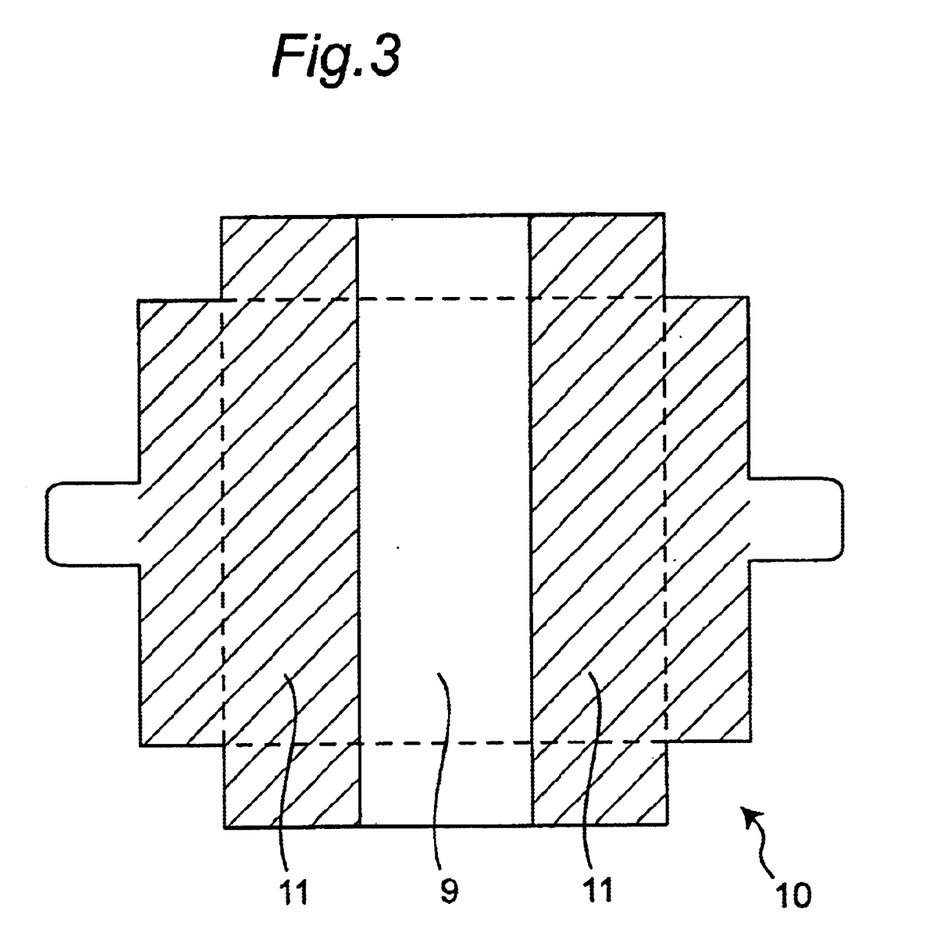
FIG. 3 is a development of a cap.

FIG. 3 is a development of cap 10. By folding in the same direction at a dotted line, cap 10 of FIG. 2 can be obtained. Insulation film 11 is affixed to both sides of cap 10. Cap soldering material 40 is connected to cap 10 in strip-form portion 9 between insulation films 11. That is, on the rear surface of cap 10, insulation film 11 is affixed on stripes. Affixing insulation film 11 in the form of stripe is extremely convenient and consequently, it can be achieved at a low cost. Note that, in this example, insulation film 11 is not affixed to fitting pawl 12 of cap 10 for fitting cap 10 into multi-layer substrate 30. This allows solder to climb up a rear surface of cap fitting pawl to enhance mounting strength when customers mounts the semiconductor module.

Figure 4:
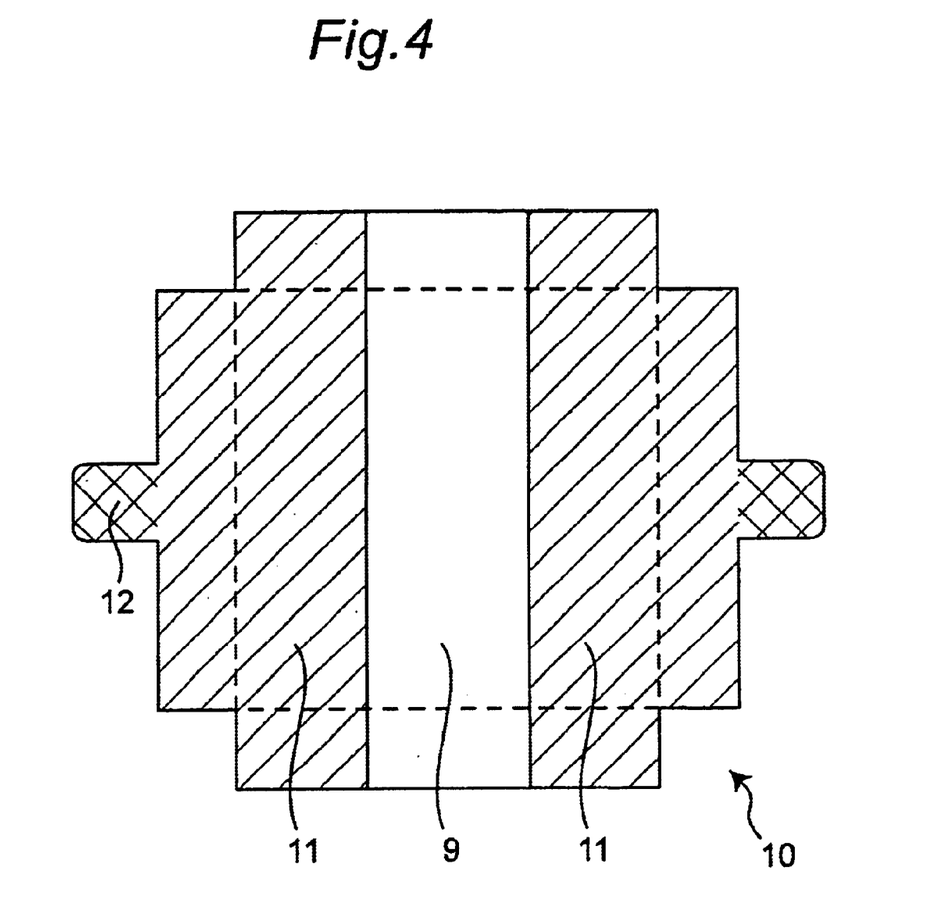
FIG. 4 is a development of a cap by the second example with insulation film affixed.

FIG. 4 is a development of cap 10 according to the second affixing example of insulation film 11. The difference from FIG. 3 lies in that insulation film 11 is affixed even to fitting-pawl 12 of cap 10. According to this configuration, the same advantages as an example shown in FIG. 3 are obtained. What is more advantageous as compared to the case in which insulation film 11 is affixed except for the portion of fitting pawl 12 is that it is no longer necessary to be aware of the accuracy of the outer periphery of stripe. Consequently, insulation film 11 can be affixed at still lower cost and therefore, the cap can be manufactured at lower cost.

Figure 5:
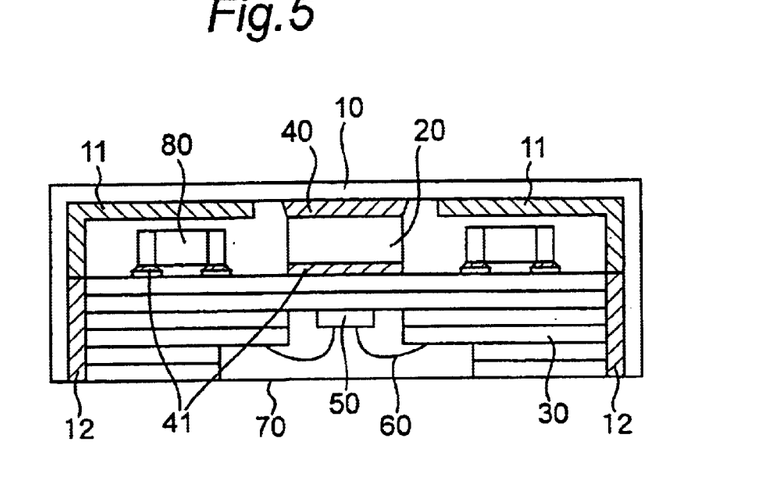
FIG. 5 is a cross-sectional view of a semiconductor module by the second example with insulation film affixed.

FIG. 5 is a cross-sectional view of semiconductor module 100 according to the second affixing example of insulation film 11. Although Insulation film 11 is affixed even to fitting pawl 12 of cap 10, such configuration affects no influence on operations of semiconductor module 100. Note that, since multi-layer substrate 30, soldering material 41, semiconductor chip 50, bonding wire 60, potting material. 70, and chip parts 80 are exactly same as those of FIG. 2. Therefore, explanations on these elements will be omitted.

Figure 6:
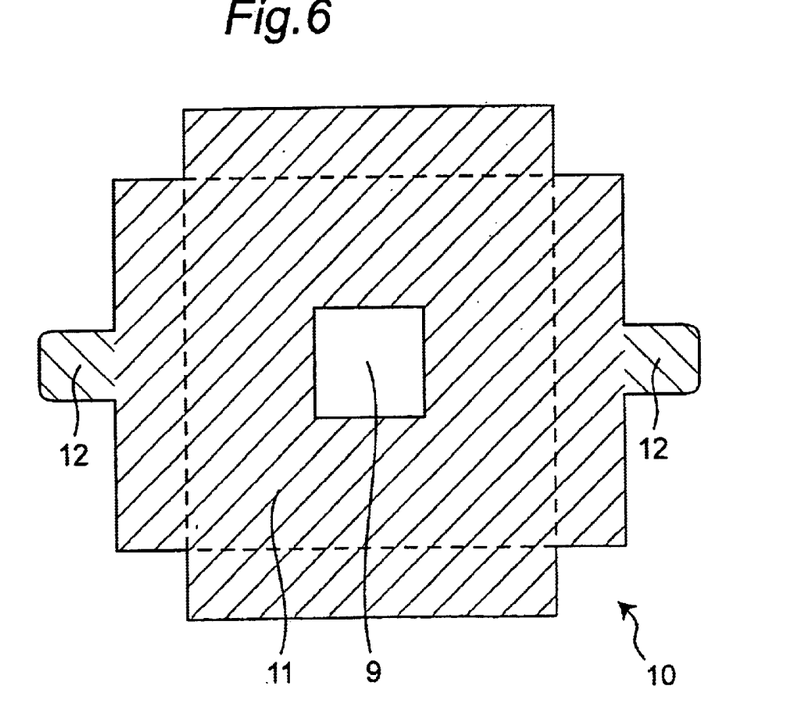
FIG. 6 is a development of a cap by the third example with insulation film affixed.

FIG. 6 is a development of cap 10 according to the third affixing example of insulation film 11. Insulation film 11 is affixed to cap 10 in all the area except for region 9 where cap soldering material 40 and cap 10 come into contact. In other words, insulation film 11 with the portion of region 9 removed (cut away) is affixed. According to this configuration, not only the same advantages as those shown in FIG. 3 are obtained but also a wider insulated portion can be obtained, and the degree of design freedom can be increased. Note that region 9 may not be exactly the region where cap soldering material 40 and cap 10 come in contact and may be varied as necessary if changes are required from the viewpoint of manufacturing.

Embodiment 2

In embodiment 2, a semiconductor module will be described, in which cap soldering material on a heat sink comes in contact with a cap via insulation film to radiate heat.

Figure 7:
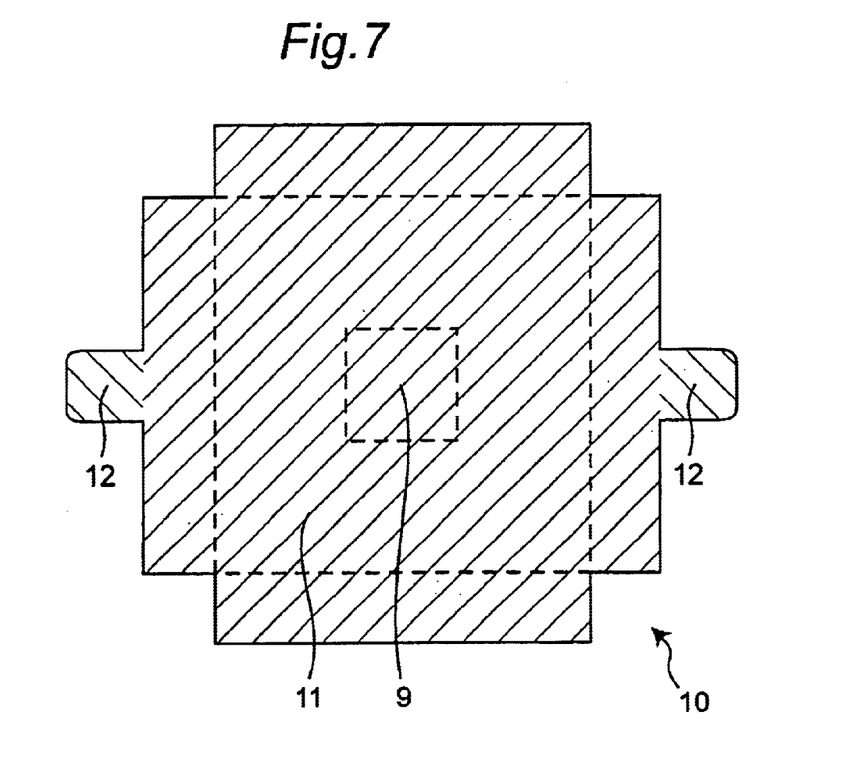
FIG. 7 is a development of semiconductor module with insulation film affixed over the whole surface.

FIG. 7 is a development of cap 10 to which insulation film 11 is affixed to the whole surface. Region 9 is the position corresponding to the upper part of heat sink. In this example, insulation film 11 is affixed to region 9. In addition, to fitting pawl 12 of cap 10, insulation film 11 is affixed.

Figure 8:
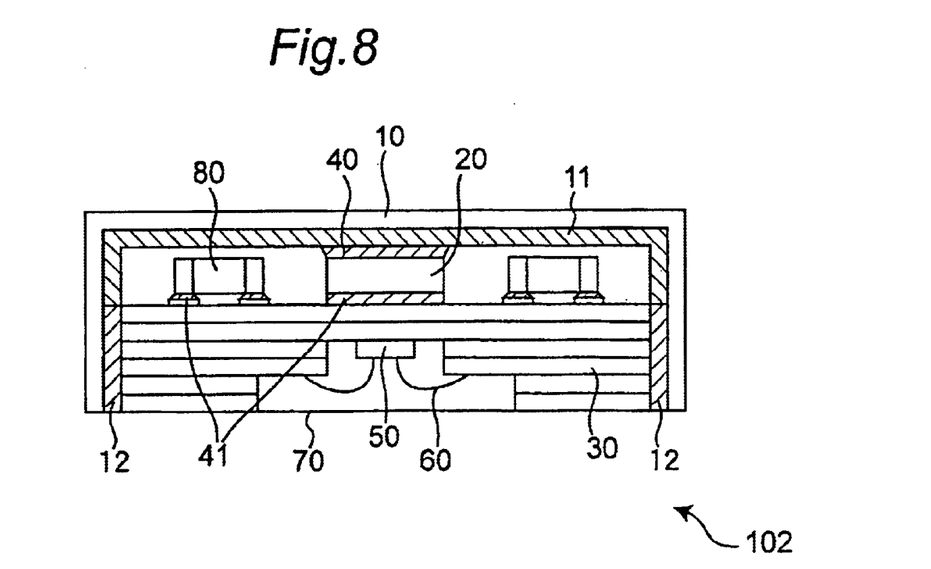
FIG. 8 is a cross-sectional view of semiconductor module according to embodiment 2.

FIG. 8 is a cross-sectional view of semiconductor module 102 according to embodiment 2. Semiconductor module 102 differs from that in FIG. 2 in the arrangement of the portion between cap 10 and heat sink 20. Description will be primarily made on the relevant different portion. Note that, since multi-layer substrate 30, soldering material 41, semiconductor chip 50, bonding wire 60, potting material 70, and chip parts 80 are exactly the same as those of FIG. 2, explanations on these elements will be omitted.

In embodiment 2, between cap 10 and heat sink 20, insulation 11 and thermoplastic resin 40 are provided in this order from the side of cap 10. Thermosetting resin 40 is provided in place of cap soldering material. Thermosetting resin 40 also provides high thermal performance and is sufficient to transfer heat liberated from heat sink 20 to cap 10. In this example, since insulation film 11 is affixed to the whole surface of cap 10, as compared to the case in which insulation film 11 is affixed except for the upper position of heat sink, a trimming process of insulation film 11 can be omitted. Consequently, cap 10 can be manufactured conveniently and inexpensively. In addition, reduction of parts contact, heat radiation performance, and parts size can be achieved similar to embodiment 1.

Figure 9:
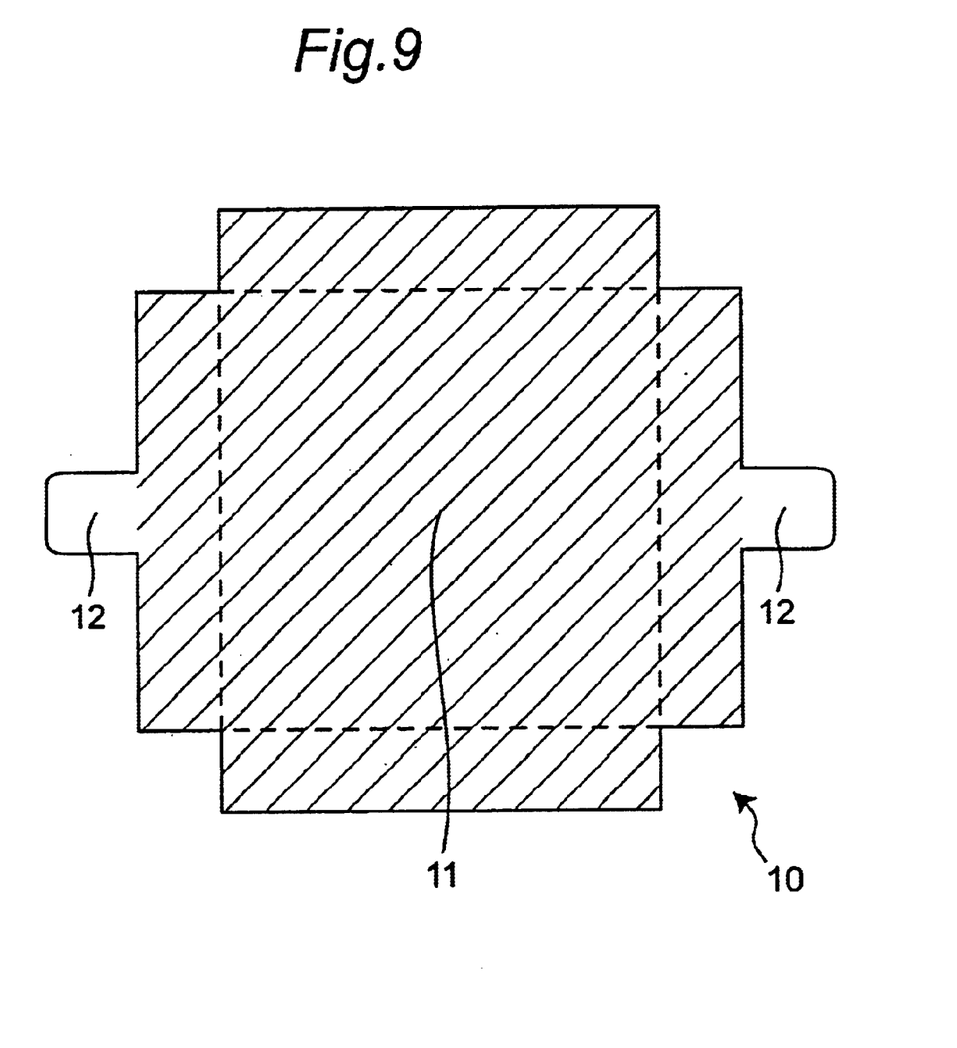
FIG. 9 is a development of a cap with insulation film affixed over the whole surface except fitting pawls.

Note that, in this example, since insulation film 11 is affixed to fitting pawl 12 of cap 10, the insulation film affixing accuracy is no longer required to be intentionally improved, and cap 10 can be manufactured more conveniently and inexpensively. However, needless to say, even if insulation film 11 is not affixed to fitting pawl 12, reduction of parts contact, heat radiation performance, and parts size can be achieved. FIG. 9 is a development of cap 10 with insulation film 11 affixed to all the surfaces except fitting pawl 12. In order to affix insulation film 11 as illustrated, an affixing accuracy of insulation film 11 must be improved. However, since no insulation film 11 exists, solder climbs up the rear surface of cap fitting pawl 12 at the time of mounting at customers and increase of mounting strength can be expected.

Embodiment 3

In embodiment 3, a semiconductor module that has a cap with a portion joined to a heat sink recessed will be described. By recessing a part of the cap, it is no longer necessary to provide the insulation film described in embodiments 1 and 2.

Figure 10:
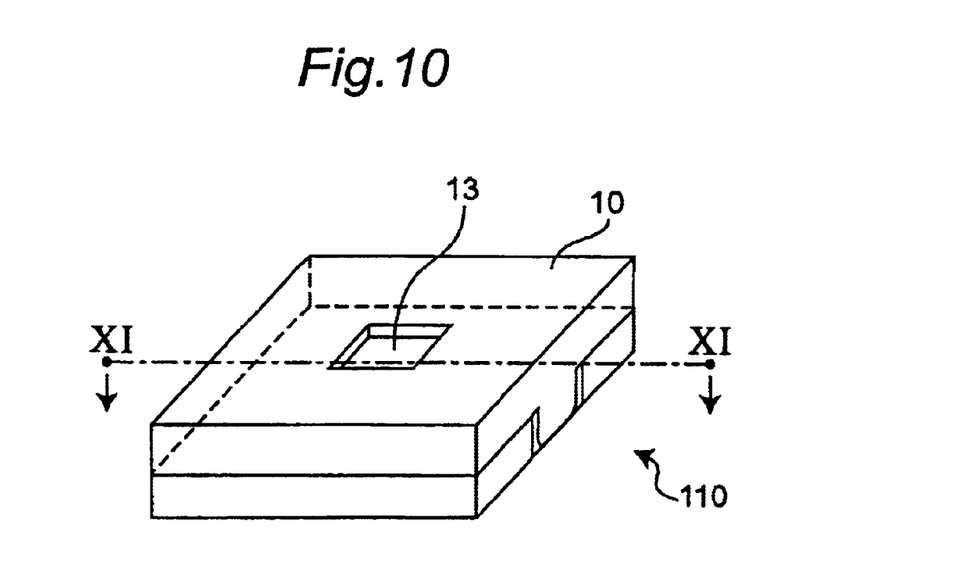
FIG. 10 is a perspective view of semiconductor module according to embodiment 3.

FIG. 10 is a perspective view of semiconductor module 110 according to embodiment 3. As shown in the figure, recess 13 folded and set back from the periphery to the multi-layer substrate 30 side is provided to cap 10. The recess designated as cap recess 13 will be discussed hereinafter. Cap recess 13 is located at the upper part of a heat sink (not illustrated).

Figure 11:
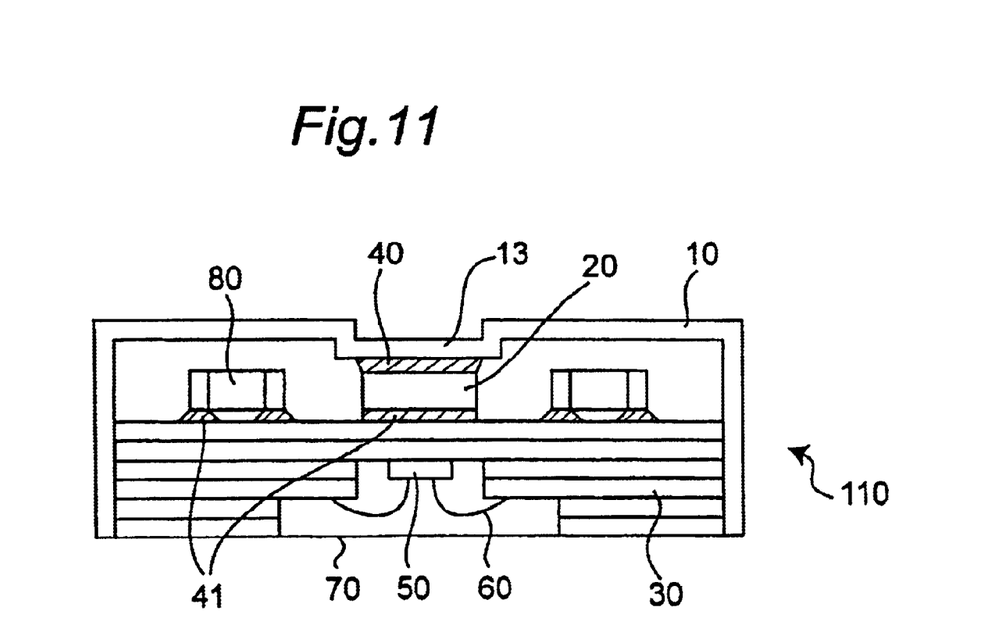
FIG. 11 is a cross-sectional view of semiconductor module cut on line A—A' of FIG. 10.

FIG. 11 shows a cross-sectional view of semiconductor module 110 cut along line A—A' of FIG. 10. Semiconductor module 110 differs from the semiconductor module of FIG. 2 in configuration of cap 10 as well as in that no insulation film 11 is affixed to cap 10 of semiconductor module 110. In the following section, description will be primarily made on the relevant different portion. Note that, since multi-layer substrate 30, soldering material 41, semiconductor chip 50, bonding wire 60, potting material 70, and chip parts 80 are exactly the same as those in FIG. 2, explanations on these elements will be omitted.

As clear from the figure, cap 10 has cap recess 13 at the upper part of heat sink 20. In other words, cap recess 13 is provided to be bent in the substrate direction of cap 10 at the outer edge of the region joined to the heat sink. Depending on set back amount (i.e. bent amount) from the surface of cap 10, clearance at the upper part of heat sink 20 can be adjusted. For example, assume that the set back amount of cap recess 13 is 0.05 mm from the surface of cap 10. Then, it is possible to gain clearance of at least 0.05 mm in the case height of heat sink 20 is 0.5±0.05 mm and inductor height which is one of peripheral chip parts 80 is 0.45±0.05 mm. Conversely, if the set back amount from the surface of cap recess 13 is increased, the height of heat sink 20 can be lowered in accordance with the increase. Therefore, heat sink 20 can be downsized and at the same time, short-circuiting of cap 10 and chip parts 80 can be avoided. The use of cap 10 described in this embodiment can eliminate a need to affix insulation film 11 as shown in FIG. 2, semiconductor modules can be manufactured at still lower cost.

Figure 12:
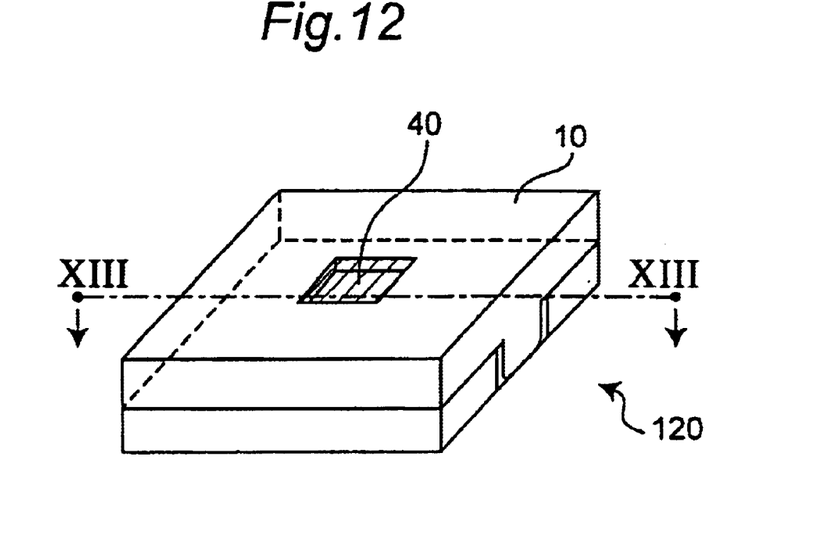
FIG. 12 is a perspective view of semiconductor module according to another example of embodiment 3.

FIG. 12 is a perspective view of semiconductor module 120 according to another example of embodiment 3. Unlike the preceding cap recess 13 (FIG. 10), a hole is provided in cap 10 of semiconductor module 120. The figure illustrates a condition in which adhesive 40 is injected in the hole to the surface of cap 10.

Figure 13:
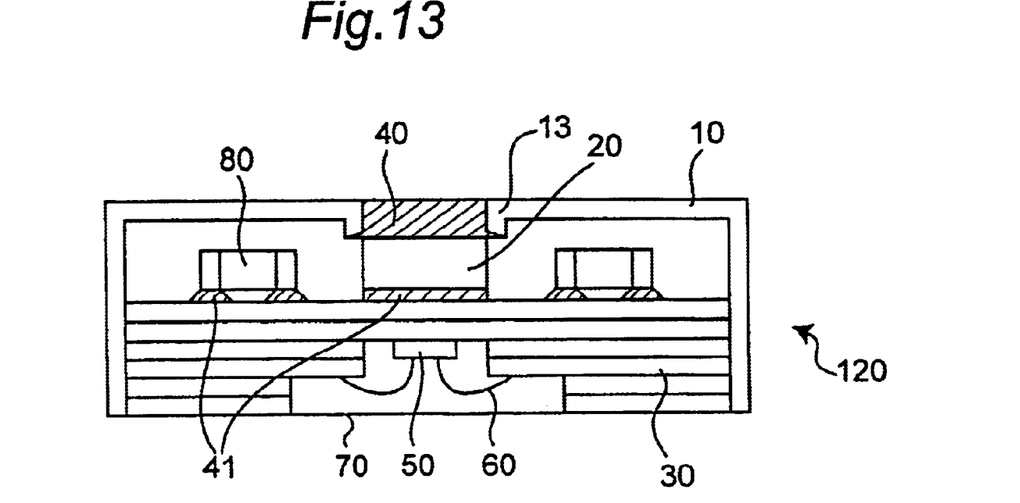
FIG. 13 is a cross-sectional view of semiconductor module cut on line A—A' of FIG. 12.

FIG. 13 shows a cross-sectional view of semiconductor module 120 cut at line A—A' of FIG. 12. Semiconductor module 120 differs from the semiconductor module of FIG. 11 in the arrangement of cap 10. In the following section, description will be primarily made on the relevant different portion. Note that, since multi-layer substrate 30, soldering material 41, semiconductor chip 50, bonding wire 60, potting material 70, and chip parts 80 are exactly the same as those in FIG. 11, explanations on these elements will be omitted.

As illustrated in FIG. 13, cap 10 of semiconductor module 120 has a hole provided in the region corresponding to the upper part of heat sink 20. This hole is obtained by removing the bottom section of cap recess 13 (FIG. 11) and passes through from the top surface of heat sink 20 to the surface of cap 10. By providing the hole, it becomes possible to dispense adhesives 40 from the top surface of the cap 10 to fill the hole with the adhesive, manufacturing efficiency can be improved. Furthermore, even when adhesive 40 is dispensed in excess, a predetermined volume of adhesive 40 is easily scraped away from the hole. Therefore, operating efficiency can be improved and the manufacturing efficiency can be further improved. Note that, because cap 10 in this modified example is obtained only by removing the bottom of cap recess 13 (FIG. 11), the advantages explained for cap 10 in FIG. 11 can be obtained as advantages of this example as they are.

Now, embodiments of the present invention have been described. In embodiments 1 and 2, in order to avoid short-circuiting between the cap and the chip parts, insulation film is provided to the surface of the cap facing the chip parts. However, if short-circuiting can be avoided, it is not necessary to restrict to this configuration. For example, thermosetting resin with nonconductive and heat transferring characteristics is applied on the substrate (on chip parts) and a cap may be affixed. Furthermore, such resin can be filled between cap 10 and multi-layer substrate 30 instead of or at the same time in applying on the chip parts. The resin also functions as an adhesive to affix cap 10 and multi-layer substrate 30.

Figure 14:
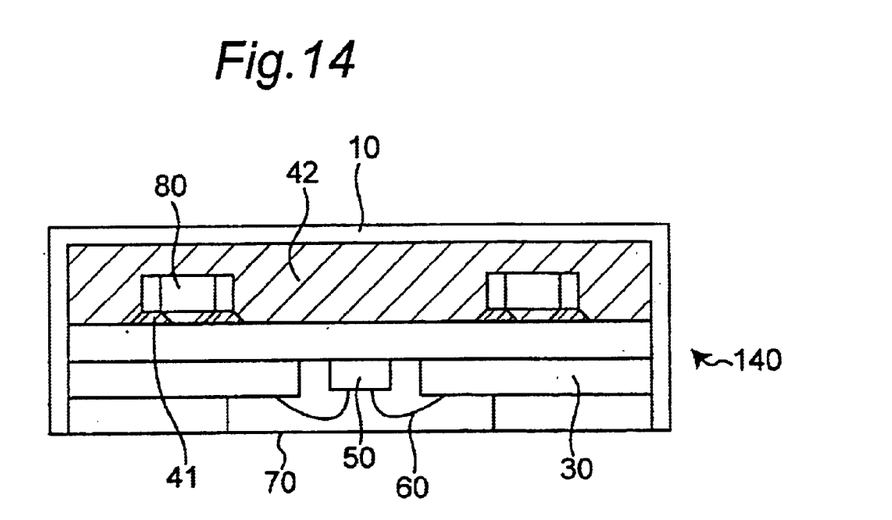
FIG. 14 is a cross-sectional view of semiconductor module related to a modified example of embodiments 1 and 2.

FIG. 14 is a cross-sectional view of semiconductor module 140 related to a modified example of embodiments 1 and 2. Semiconductor module 140 is formed by filling a space defined between facing surfaces of cap 10 and multi-layer substrate 30, or surfaces of cap 10 and chip parts 80, with nonconductive resin (adhesive agent) 42. The adhesive agent is, for example, thermosetting resin such as epoxy resin. Cap 10 is brought in direct contact with nonconductive resin and fixed. According to this arrangement, electrical short-circuiting may not occur, since nonconductive resin is inserted between cap 10 and chip parts 80. In addition, because heat generated at semiconductor chip 50 is transmitted directly to cap through nonconductive resin, the heat sink can be eliminated. Consequently, the physical dimensions of semiconductor module 140 can be extremely reduced.

Figure 15:
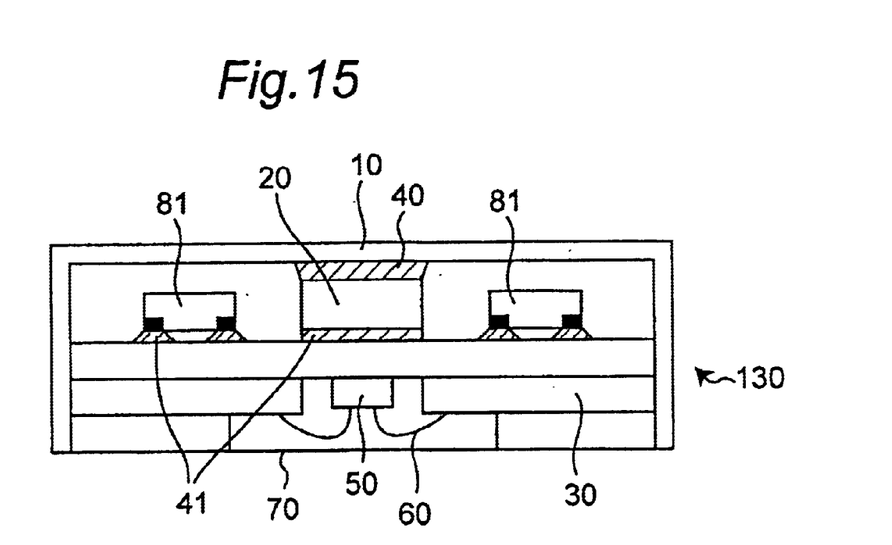
FIG. 15 is a view showing a semiconductor module using filletless chip parts.

In addition, by using one or more filletless parts for all the chip parts 80, the semiconductor module can be downsized. "Fillet" referred to here means a solder-buildup or a shape the solder-buildup that expands from top to bottom when electrode terminal of element and mounting land are soldered. Consequently, "filletless parts" means parts free of such solder-buildup. FIG. 15 is a diagram showing semiconductor module 130 using filletless chip parts 81. In this figure, multi-layer substrate 30, soldering material 41, semiconductor chip 50, bonding wire 60, and potting material 70 are exactly the same as those in FIG. 2, and explanations on these elements will be omitted. The use of filletless parts can lower the cap and can prevent short-circuiting because electrode terminals and the cap will not be brought into contact and no unwanted solder buildup exists. In addition, since the land width or land area can be made smaller, the mounting area of chip parts 80 can be reduced. As a result, simply downsizing conventional caps and heat sinks enables downsizing semiconductor modules without providing insulation film to the cap. If filletless parts are used in semiconductor modules of embodiments 1 through 3, advantages of each of embodiments 1 through 3 can be obtained and further downsizing can be promoted.

The invention being thus described, it will be obvious that the same may be varied in many ways. Such variations are not to be regarded as a departure from the spirit and scope of the invention, and all such modifications as would be obvious to one skilled in the art are intended to be included within the cope of the following claims.

What is claimed is:

1. A semiconductor device comprising:
    a substrate having a first surface with a cavity and a second surface, opposite the first surface;
    a semiconductor chip in the cavity and electrically connected to the substrate;
    at least one passive electrical component chip mounted on the second surface of the substrate and electrically connected to the substrate;
    a heat sink mounted on the second surface of the substrate and transferring heat liberated from the semiconductor chip;
    a cap fitted on the substrate, covering the second surface of the substrate, having an inside surface, part of which is opposite the second surface, and joined to the heat sink; and
    an insulator disposed on at least part of the inside surface of the cap, between the inside surface of the can and the at least one passive electrical component chip.

2. The semiconductor device according to claim 1, wherein the insulator comprises stripes disposed on the inside surface of the cap.

3. The semiconductor device according to claim 1, wherein the insulator covers all of the inside surface of the cap, other than a region of the inside surface of the cap to which the heat sink is joined.

4. The semiconductor device according to claim 1, wherein the insulator covers all of the inside surface of the cap.

5. The semiconductor device according to claim 1, wherein the cap has at least one fitting pawl that secures the cap to the substrate, and the insulator does not cover the at least one fitting pawl.

6. The semiconductor device according to claim 1, wherein the cap has at least one fitting pawl that secures the cap to the substrate, and the insulator covers the at least one fitting pawl.

7. The semiconductor device according to claim 1, wherein the insulator is a thermosetting resin.

8. A semiconductor device comprising:
    a substrate having a first surface with a cavity and a second surface, opposite the first surface;
    a semiconductor chip in the cavity and electrically connected to the substrate;
    at least one passive electrical component chip mounted on the second surface of the substrate and electrically connected to the substrate;
    a heat sink mounted on the second surface of the substrate and transferring heat liberated from the semiconductor chip; and
    a cap fitted on the substrate, covering the second surface of the substrate, having an inside surface, part of which is opposite the second surface, and joined to the heat sink, wherein the cap is bent toward the second surface of the substrate at an outer edge of a region of the cap that is joined to the heat sink.

9. The semiconductor device according to claim 8, including a hole in the region of the cap, and including an adhesive material for transferring heat filling the hole.

* * * * *